US012581926B2

(12) United States Patent
Mebarki et al.

(10) Patent No.: US 12,581,926 B2
(45) Date of Patent: Mar. 17, 2026

(54) METHODS AND APPARATUS FOR PROCESSING A SUBSTRATE

(71) Applicant: Applied Materials, Inc., Santa Clara, CA (US)

(72) Inventors: Bencherki Mebarki, Santa Clara, CA (US); Joung Joo Lee, San Jose, CA (US); Komal Garde, Santa Clara, CA (US); Kishor Kumar Kalathiparambil, Santa Clara, CA (US); Xianmin Tang, San Jose, CA (US); Xiangjin Xie, Fremont, CA (US); Rui Li, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 17/375,654

(22) Filed: Jul. 14, 2021

(65) Prior Publication Data

US 2023/0017383 A1    Jan. 19, 2023

(51) Int. Cl.
H01L 21/768 (2006.01)
C23C 14/34 (2006.01)
H01L 21/285 (2006.01)

(52) U.S. Cl.
CPC .... H01L 21/76883 (2013.01); C23C 14/3492 (2013.01); H01L 21/2855 (2013.01)

(58) Field of Classification Search
CPC .......... H01L 21/76883; H01L 21/2855; H01L 21/28568; H01L 21/02266; H01L 21/32136; H01L 21/76877; C23C 14/3492; C23C 14/046; C23C 14/18; C23C 14/345; C23C 14/35; C23C 14/5873; C23C 14/14; H01J 37/3405; H01J 37/3426
See application file for complete search history.

(56) References Cited

U.S. PATENT DOCUMENTS

| 5,614,060 | A | 3/1997 | Hanawa |
| 5,962,923 | A | 10/1999 | Xu et al. |

(Continued)

FOREIGN PATENT DOCUMENTS

| CN | 1656243 | B | 6/2010 |
| KR | 2012/0005992 | A | 1/2012 |
| TW | 201824388 | | 7/2018 |

OTHER PUBLICATIONS

International Search Report for PCT/US2022/033809, dated Oct. 12, 2022.
European Search Report for EP22842629, dated Apr. 30, 2025.

*Primary Examiner* — Patrick S Ott
(74) *Attorney, Agent, or Firm* — Moser Taboada

(57) ABSTRACT

Methods and apparatus for processing a substrate are provided. For example, a method includes sputtering a material from a target in a PVD chamber to form a material layer on a layer comprising a feature of the substrate, the feature having an opening width defined by a first sidewall and a second sidewall, the material layer having a greater lateral thickness at the top surface of the layer than a thickness on the first sidewall or the second sidewall within the feature, depositing additional material on the layer by biasing the layer with an RF bias at a low power, etching the material layer from the layer by biasing the layer with an RF bias at a high-power, and repeatedly alternating between the low power and the high-power at a predetermined frequency.

17 Claims, 3 Drawing Sheets

(56)  References Cited

U.S. PATENT DOCUMENTS

| | | | |
|---|---|---|---|
| 5,976,327 | A | 11/1999 | Tanaka |
| 6,051,114 | A | 4/2000 | Yao et al. |
| 6,080,285 | A | 6/2000 | Liu et al. |
| 6,313,027 | B1 | 11/2001 | Xu et al. |
| 7,514,375 | B1 | 4/2009 | Shanker et al. |
| 8,043,973 | B2 | 10/2011 | Goodlin et al. |
| 8,298,936 | B1 | 10/2012 | Rozbicki et al. |
| 8,343,592 | B2 | 1/2013 | Kudela et al. |
| 8,871,643 | B2 | 10/2014 | Eguchi et al. |
| 9,899,258 | B1 | 2/2018 | Wu et al. |
| 10,347,500 | B1 * | 7/2019 | Doh ................... H01L 21/30655 |
| 2002/0068464 | A1 * | 6/2002 | Forster ................ H01J 37/3405 |
| | | | 438/758 |
| 2003/0034244 | A1 * | 2/2003 | Yasar ................. H01L 21/76862 |
| | | | 257/E21.585 |
| 2004/0134769 | A1 * | 7/2004 | Wang ................... H01L 21/2855 |
| | | | 257/E21.585 |
| 2008/0190760 | A1 * | 8/2008 | Tang ................... H01J 37/3408 |
| | | | 204/192.17 |
| 2010/0009533 | A1 * | 1/2010 | Shaviv .............. H01L 21/68714 |
| | | | 438/653 |
| 2010/0105204 | A1 | 4/2010 | Lam et al. |
| 2013/0101750 | A1 | 4/2013 | Yang et al. |
| 2014/0046475 | A1 * | 2/2014 | Lam ......................... C23C 14/54 |
| | | | 204/229.4 |
| 2016/0358784 | A1 | 12/2016 | Hudson et al. |
| 2017/0040214 | A1 | 2/2017 | Lai et al. |
| 2017/0053811 | A1 * | 2/2017 | Fung ................... C23C 16/045 |
| 2021/0391176 | A1 * | 12/2021 | Mebarki ............. H01J 37/3426 |

* cited by examiner

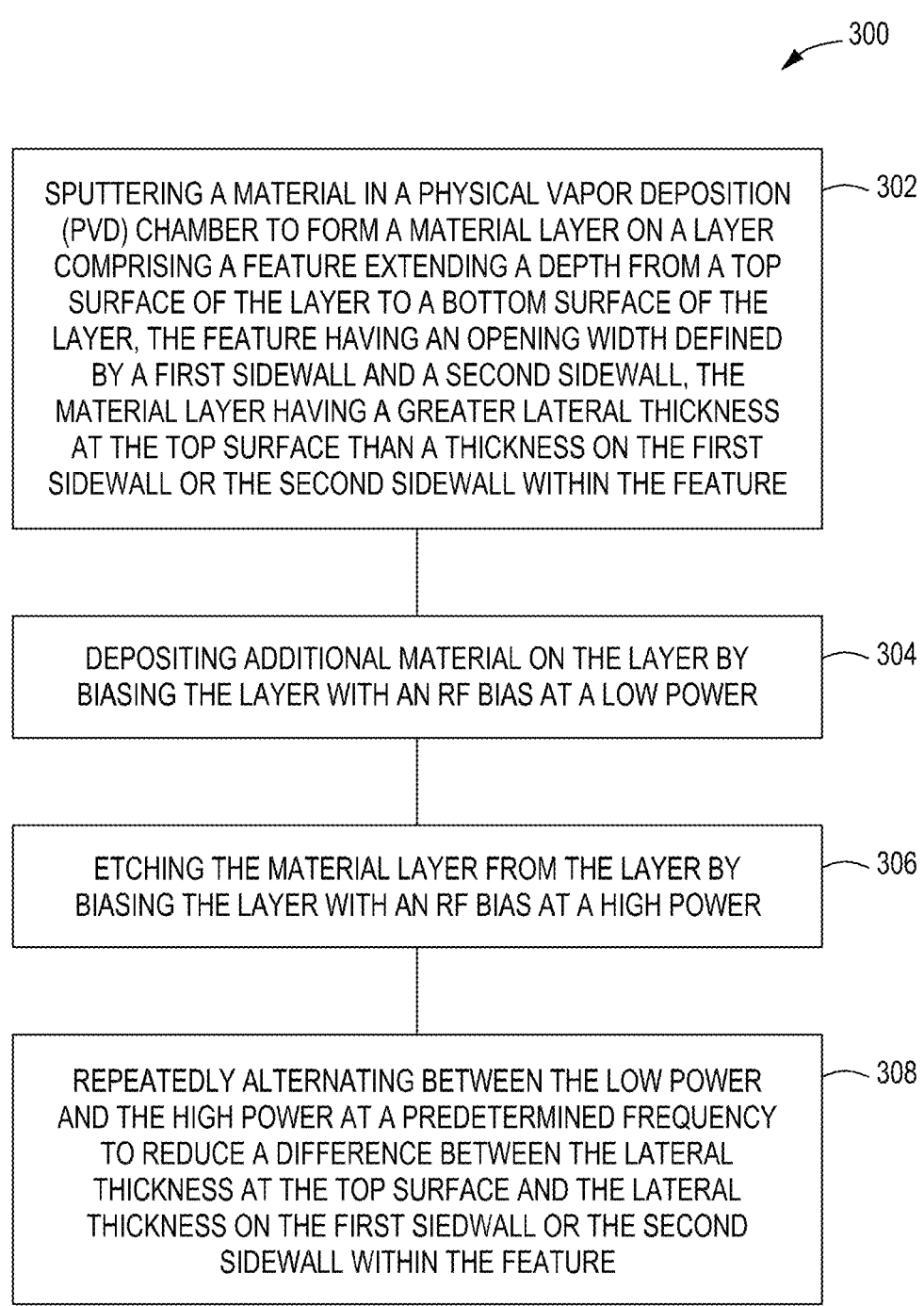

300

SPUTTERING A MATERIAL IN A PHYSICAL VAPOR DEPOSITION (PVD) CHAMBER TO FORM A MATERIAL LAYER ON A LAYER COMPRISING A FEATURE EXTENDING A DEPTH FROM A TOP SURFACE OF THE LAYER TO A BOTTOM SURFACE OF THE LAYER, THE FEATURE HAVING AN OPENING WIDTH DEFINED BY A FIRST SIDEWALL AND A SECOND SIDEWALL, THE MATERIAL LAYER HAVING A GREATER LATERAL THICKNESS AT THE TOP SURFACE THAN A THICKNESS ON THE FIRST SIDEWALL OR THE SECOND SIDEWALL WITHIN THE FEATURE — 302

DEPOSITING ADDITIONAL MATERIAL ON THE LAYER BY BIASING THE LAYER WITH AN RF BIAS AT A LOW POWER — 304

ETCHING THE MATERIAL LAYER FROM THE LAYER BY BIASING THE LAYER WITH AN RF BIAS AT A HIGH POWER — 306

REPEATEDLY ALTERNATING BETWEEN THE LOW POWER AND THE HIGH POWER AT A PREDETERMINED FREQUENCY TO REDUCE A DIFFERENCE BETWEEN THE LATERAL THICKNESS AT THE TOP SURFACE AND THE LATERAL THICKNESS ON THE FIRST SIEDWALL OR THE SECOND SIDEWALL WITHIN THE FEATURE — 308

FIG. 3

METHODS AND APPARATUS FOR PROCESSING A SUBSTRATE

FIELD

Embodiments of the present disclosure generally relate to method and apparatus for processing a substrate, and more particularly, methods and apparatus for reducing overhang and improve opening width for physical vapor deposition (PVD) films deposited within a feature.

BACKGROUND

The miniaturization of semiconductor circuit elements has reached a point where feature sizes of 45 nm, 32 nm, 28 nm, 20 nm and even less are fabricated on a commercial scale. As the dimensions of features continue to get smaller, new challenges arise for process steps like filling a gap between circuit elements. As the width between the elements continues to shrink, the gap between the elements often gets taller and narrower, making the gap more difficult to fill without the gapfill material creating voids and weak seams.

Sputtering, alternatively called PVD, is used for the deposition of metals and other materials in the fabrication of semiconductor integrated circuits. Use of sputtering has been extended to depositing material layers onto the sidewalls of high aspect-ratio (HAR) holes or gaps such as vias or other vertical interconnect structures.

PVD techniques often experience an overgrowth or overhang of material at the top of the gap before the gap has been completely filled. The overhang can create a void or seam in the gap where the deposited material has been cut off by the overhang, a problem sometimes referred to as breadloafing.

Current methods of reducing overhang utilize a continuous wave (CW) bias applied to the substrate, but such methods have a limited power range. Further, CW bias can cause damage to the underlying substrate when operated at high-power levels.

SUMMARY

Methods and apparatus for processing a substrate are provided herein. In some embodiments, a method of physical vapor deposition on a substrate includes sputtering a material from a target in a physical vapor deposition (PVD) chamber to form a material layer on a layer comprising a feature extending a depth from a top surface of the layer to a top surface of a base layer on which the layer is deposited, the feature having an opening width defined by a first sidewall and a second sidewall, the material layer having a greater lateral thickness at the top surface of the layer than a thickness on the first sidewall or the second sidewall within the feature, depositing additional material on the layer by biasing the layer with an RF bias at a low power, etching the material layer from the layer by biasing the layer with an RF bias at a high-power, and repeatedly alternating between the low power and the high-power at a predetermined frequency to reduce a difference between the lateral thickness at the top surface of the layer and the lateral thickness on the first sidewall or the second sidewall within the feature.

In accordance with at least some embodiments, a non-transitory computer readable storage medium has stored thereon instructions that when executed by a processor perform a method of physical vapor deposition on a substrate. The method includes sputtering a material from a target in a physical vapor deposition (PVD) chamber to form a material layer on a layer comprising a feature extending a depth from a top surface of the layer to a top surface of a base layer on which the layer is deposited, the feature having an opening width defined by a first sidewall and a second sidewall, the material layer having a greater lateral thickness at the top surface of the layer than a thickness on the first sidewall or the second sidewall within the feature, depositing additional material on the layer by biasing the layer with an RF bias at a low power, etching the material layer from the layer by biasing the layer with an RF bias at a high-power, and repeatedly alternating between the low power and the high-power at a predetermined frequency to reduce a difference between the lateral thickness at the top surface of the layer and the lateral thickness on the first sidewall or the second sidewall within the feature.

In accordance with at least some embodiments, a method of physical vapor deposition on a substrate includes sputtering a material from a target in a physical vapor deposition (PVD) chamber to form a material layer on a layer comprising a feature extending a depth from a top surface of the layer to a top surface of a base layer on which the layer is deposited, the feature having an opening width defined by a first sidewall and a second sidewall, the material layer having a greater lateral thickness at the top surface of the layer than a thickness on the first sidewall or the second sidewall within the feature, depositing additional material on the layer by biasing the layer with an RF bias at a low power and at a dual frequency from about 2 MHz to about 60 MHz, etching the material layer from the layer by biasing the layer with an RF bias at a high-power and at the dual frequency from about 2 MHz to about 60 MHz, and repeatedly alternating between the low power and the high-power at a predetermined frequency within the dual frequency to reduce a difference between the lateral thickness at the top surface of the layer and the lateral thickness on the first sidewall or the second sidewall within the feature.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 3 is a flowchart of a method for processing a substrate, in accordance with at least some embodiments of the present disclosure.

Figure 1:
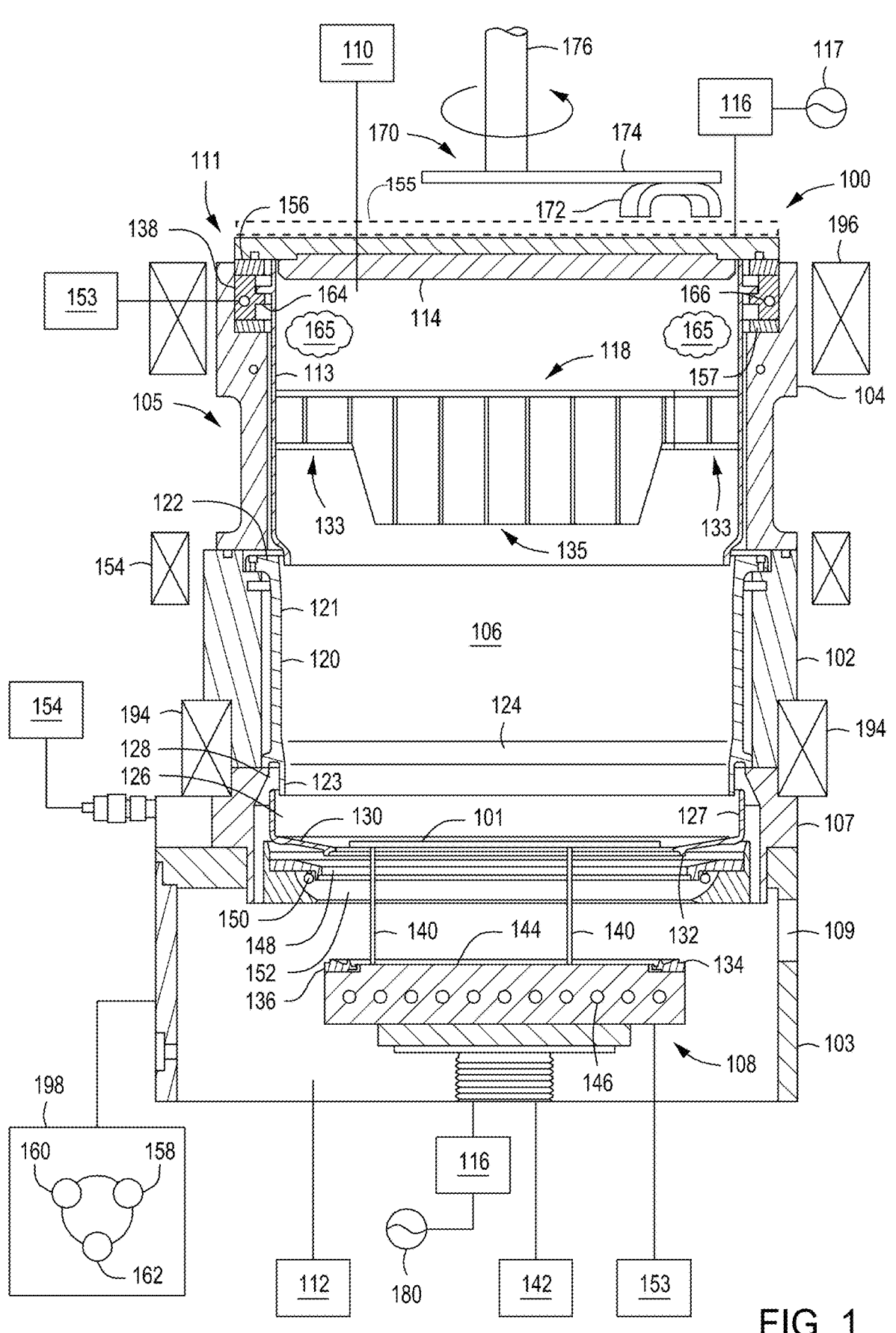
FIG. 1 is a schematic cross-sectional view of a processing chamber, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For examples, methods of physical vapor deposition on a substrate can include sputtering a material from a target in a PVD chamber to form a material layer on a layer comprising a feature extending a depth from a top surface of the layer to a top surface of a base layer on which the layer is deposited. In at least some embodiments, the feature has an opening width defined by a first sidewall and a second sidewall. The material layer can have a greater lateral thickness at the top surface of the layer than a thickness on the first sidewall or the second sidewall within the feature. Next, additional material can be deposited on the layer by biasing the layer with an RF bias at a low power. Next, the material layer can be etched from the layer by biasing the layer with an RF bias at a high-power. Next, the method can include repeatedly alternating between the low power and the high-power at a predetermined frequency to reduce a difference between the lateral thickness at the top surface of the layer and the lateral thickness on the first sidewall or the second sidewall within the feature. The methods and apparatus described herein mitigate/minimize overhang issues related to PVD processes and make subsequent metallization steps easier to achieve by providing larger top feature openings.

FIG. 1 depicts a schematic side view of a processing chamber 100 (e.g., a plasma processing chamber), in accordance with at least some embodiments of the present disclosure. In some embodiments, the processing chamber 100 is a PVD processing chamber suitable for sputter depositing materials on a substrate having a given diameter. Illustrative examples of suitable PVD chambers that may be adapted to benefit from the present disclosure include those commercially available from Applied Materials, Inc., of Santa Clara, Calif. Other processing chambers available from Applied Materials, Inc. as well as other manufacturers may also be adapted in accordance with the embodiments described herein.

The processing chamber 100 generally includes an upper sidewall 102, a lower sidewall 103, a ground adapter 104, and a lid assembly 111 defining a body 105 that encloses an interior volume 106. An adapter plate 107 may be disposed between the upper sidewall 102 and the lower sidewall 103.

A substrate support 108 is disposed in the interior volume 106 of the processing chamber 100. The substrate support 108 is configured to support a substrate having a given diameter (e.g., 150 mm, 200 mm, 300 mm, 450 mm, or the like). A substrate transfer port 109 is formed in the lower sidewall 103 for transferring substrates into and out of the interior volume 106.

A gas source 110 is coupled to the processing chamber 100 to supply process gases into the interior volume 106. In some embodiments, process gases may include inert gases, non-reactive gases, and reactive gases, if necessary. Examples of process gases that may be provided by the gas source 110 include, but are not limited to, argon gas (Ar), helium (He), neon gas (Ne), nitrogen gas ($N_2$), oxygen gas ($O_2$), and water ($H_2O$) vapor, among others.

A pumping device 112 is coupled to the processing chamber 100 in communication with the interior volume 106 to control the pressure of the interior volume 106. In some embodiments, during deposition the pressure level of the processing chamber 100 may be maintained from about 0.001 mTorr to about 1 Torr.

The ground adapter 104 may support a target, such as target 114. The target 114 is fabricated from a material to be deposited on the substrate. In some embodiments, the target 114 may be fabricated from aluminum (Al), cobalt (Co), copper (Cu), indium (In), molybdenum (Mo), nickel (Ni), rhodium (Rh), ruthenium (Ru), tantalum (Ta), titanium (Ti), tungsten (W), alloys thereof, combinations thereof, or the like. In some embodiments, the processing chamber 100 is configured to deposit, for example, aluminum (Al), cobalt (Co), copper (Cu), indium (In), molybdenum (Mo), nickel (Ni), rhodium (Rh), ruthenium (Ru), tantalum (Ta), titanium (Ti), tungsten (W), alloys thereof, combinations thereof, or the like, In some embodiments, the processing chamber 100 is configured to deposit, for example, aluminum oxide ($AlO_2$), aluminum oxynitride (such as ALON), tantalum nitride (TaN), tantalum oxynitride (TaOxNy), Ti oxynitride (TiOxNy), or tungsten nitride (WN) on a substrate. The shape of a front surface of the target 114 can be planar or generally concave with thicker outer peripheral edges than inner diameter portions.

The target 114 may be coupled to a source assembly comprising a power supply 117 for the target 114. In some embodiments, the power supply 117 may be an RF power supply, which may be coupled to the target 114 via a matching network 116. In some embodiments, the power supply 117 may alternatively be a DC power supply, in which case the matching network 116 is omitted. In some embodiments, the power supply 117 may include both DC and RF power sources. The power supply 117 negatively biases the target 114 with respect to the ground adapter 104 or a grounded shield to excite a plasma gas into a plasma 165. For example, regardless of the type of power supply 117, the power supplied to the target 114 excites the plasma processing gas into a plasma and positively charged ions of the plasma are accelerated towards the target 114 and sputter material from the target 114.

Additionally, in some embodiments, the target 114 may include a backing plate (not shown in FIG. 1), which can be provided to improve structural stability of the target 114. The backing plate may comprise a conductive material, such as copper-zinc, copper-chrome, or the same material as the target 114, such that RF, and optionally DC, power can be coupled to the target 114 via the backing plate. Alternatively, the backing plate may be non-conductive and may include conductive elements (not shown) such as electrical feedthroughs or the like.

A magnetron 170 is positioned above the target 114 and may include a one or more magnets 172, which are rotatable along a pathway, supported by a base plate 174 connected to a shaft 176, which may be axially aligned with the central axis of the processing chamber 100 and the substrate 101. The one or more magnets 172 produce a magnetic field within the processing chamber 100 near the front face of the target 114 to generate plasma so a significant flux of ions strike the target 114, causing sputter emission of target material. The one or more magnets 172 may be rotated about the shaft 176 to increase uniformity of the magnetic field across the surface of the target 114. In general, the one or more magnets 172 may be rotated such that the innermost magnet position during rotation of the one or more magnets 172 is disposed above or outside of the diameter of the substrate being processed (e.g., the distance from the axis of rotation to the innermost position of the one or more magnets 172 is equal to or greater than the diameter of the substrate being processed).

A collimator 118 can be positioned in the interior volume 106 between the target 114 and the substrate support 108. A central region 135 of the collimator 118 generally corresponds to the diameter of the substrate being processed (e.g., is equal to or substantially equal to the diameter of the substrate). Thus, a peripheral region 133 of the collimator 118 generally corresponds to an annular region radially outward of the substrate being processed (e.g., the inner diameter of the peripheral region 133 is substantially equal to or greater than the diameter of the substrate). In some embodiments, the collimator 118 may be electrically biased to control ion flux to the substrate and neutral angular distribution at the substrate, as well as to increase the deposition rate due to the added DC bias.

The collimator 118 is coupled to an upper shield 113, which in turn is coupled to the process tool adapter 138. The process tool adapter 138 may be made from suitable conductive materials compatible with processing conditions in the processing chamber 100. An insulator ring 156 and an insulator ring 157 are disposed on either side of the process tool adapter 138 to electrically isolate the process tool adapter 138 from the ground adapter 104. The insulator rings 156, 157 may be made from suitable process compatible dielectric materials.

In some embodiments, a first set of magnets 196 may be disposed adjacent to the ground adapter 104 to assist with generating the magnetic field to guide dislodged ions from the target 114 through the peripheral region 133. In some embodiments, a second set of magnets 194 may be disposed in a position to form a magnetic field between the bottom of the collimator 118 and the substrate to guide the metallic ions dislodged from the target 114 and distribute the ions more uniformly over the substrate 101. In some embodiments, a third set of magnets 154 may be disposed between the first and second set of magnets 196, 194 and about centered with or below a substrate-facing surface of the central region 135 of the collimator 118 to further guide the metallic ions towards the center of the substrate 101.

The process tool adapter 138 includes one or more features to facilitate supporting a process tool within the interior volume 106, such as the collimator 118. For example, as shown in FIG. 1, the process tool adapter 138 includes a mounting ring, or shelf 164 that extends in a radially inward direction to support the upper shield 113.

In some embodiments, a coolant channel 166 may be provided in the process tool adapter 138 to facilitate flowing a coolant through the process tool adapter 138 to remove heat generated during processing. For example, the coolant channel 166 may be coupled to a cooling apparatus 153 (coolant source) to provide a suitable coolant, such as water (deionized water), nitrogen, argon, or other noble gas, clean dry air (CDA), or corrosive gas, etc. The coolant channel 166 advantageously removes heat from the process tool (e.g., collimator 118) that is not readily transferred to other cooled chamber components, such as the ground adapter 104.

A radially inwardly extending ledge (e.g., the mounting ring, or shelf 164) is provided to support the upper shield 113 within the central opening within the interior volume 106 of the processing chamber 100. In some embodiments the shelf 164 is disposed in a location proximate the coolant channel 166 to facilitate maximizing the heat transfer from the collimator 118 to the coolant flowing in the coolant channel 166 during use.

In some embodiments, a lower shield 120 may be provided in proximity to the collimator 118 and interior of the ground adapter 104 or the upper sidewall 102. The lower shield 120 may include a tubular body 121 having a radially outwardly extending flange 122 disposed in an upper surface of the tubular body 121. The flange 122 provides a mating interface with an upper surface of the upper sidewall 102. In some embodiments, the tubular body 121 of the lower shield 120 may include a shoulder region 123 having an inner diameter that is less than the inner diameter of the remainder of the tubular body 121. In some embodiments, the inner surface of the tubular body 121 transitions radially inward along a tapered surface 124 to an inner surface of the shoulder region 123. A shield ring 126 may be disposed in the processing chamber 100 adjacent to the lower shield 120 and intermediate of the lower shield 120 and the adapter plate 107. The shield ring 126 may be at least partially disposed in a recess 128 formed by an opposing side of the shoulder region 123 of the lower shield 120 and an interior sidewall of the adapter plate 107.

In some embodiments, the shield ring 126 may include an axially projecting annular sidewall 127 that has an inner diameter that is greater than an outer diameter of the shoulder region 123 of the lower shield 120. A radial flange 130 extends from the annular sidewall 127. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recess 134 formed in an edge ring 136 disposed on the substrate support 108. The recess 134 may be a circular groove formed in the edge ring 136. The engagement of the protrusion 132 and the recess 134 centers the shield ring 126 with respect to the longitudinal axis of the substrate support 108. The substrate 101 (shown supported on lift pins 140) is centered relative to the longitudinal axis of the substrate support 108 by coordinated positioning calibration between the substrate support 108 and a robot blade (not shown).

One or more additional RF power sources (e.g., bias power source) can be coupled to the processing chamber 100. For example, one or more RF power sources 180 may be coupled to the processing chamber 100 through the substrate support 108 to provide a bias power between the target 114 and the substrate support 108, which is conductive to act as an electrode. For example, a bias in the presence of a plasma within processing chamber 100 causes a negative self-bias to develop on the substrate support 108 so that sputtered material (e.g., metal ions) can be accelerated towards the substrate 101 and enter deep within any high aspect-ratio holes or features formed in the substrate 101. In some embodiments, a match network (e.g., the matching network 116) can be coupled between the RF power source 180 and the substrate support 108. In some embodiments, the RF power source 180 may have a frequency between about 400 Hz and about 60 MHz, such as about 13.56 MHz. In at least some embodiments, the RF power source can be configured to provide RF power at two or more frequencies. For example, in at least some embodiments, the RF power source can be dual frequency (e.g., from about 2 MHz to about 60 MHz, such as about 13.56 MHz to about 40 MHz) capable of providing RF power at different frequencies. In at least some embodiments, two or more RF power sources each operable to provide RF power at different frequencies can be used. For example, a first RF power source can be operable to provide RF power at a frequency of about 13.56 MHz and a second power source can be operable to provide RF power at a frequency of about 40 MHz. In at least some embodiments, an inductively coupled plasma (ICP) coil 155 (shown in phantom) can be used to provide RF power at about 2 MHz separately. In some embodiments, the RF power source 180 provides an amplitude pulsing modulated phase-shift keying signal and provide RF power at the same frequency that the matching network 116 operates at, as will be described in greater detail below.

In operation, a robot blade (not shown) having the substrate 101 disposed thereon is extended through the substrate transfer port 109. The substrate support 108 may be lowered to allow the substrate 101 to be transferred to the lift pins 140 extending from the substrate support 108. Lifting and lowering of the substrate support 108 and/or the lift pins 140 may be controlled by a drive 142 coupled to the substrate support 108. The substrate 101 may be lowered onto a substrate receiving surface 144 of the substrate support 108. With the substrate 101 positioned on the substrate receiving surface 144 of the substrate support 108, sputter deposition may be performed on the substrate 101. The edge ring 136 may be electrically insulated from the substrate 101 during processing.

After sputter deposition, the substrate 101 may be elevated utilizing the lift pins 140 to a position that is spaced away from the substrate support 108. The elevated location may be proximate one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon.

After controlling the substrate 101 to a predetermined temperature, the substrate 101 is lowered to a position on the substrate receiving surface 144 of the substrate support 108. The substrate 101 may be rapidly cooled utilizing thermal control channels 146 in the substrate support 108 via conduction. For example, the cooling apparatus 153 can be connected to the substrate support 108 and be configured to provide one or more coolants to the substrate support. The substrate 101 may be removed from the processing chamber 100 through the substrate transfer port 109 for further processing.

A controller 198 is coupled to the processing chamber 100. The controller 198 includes a central processing unit 160, a memory 158, and support circuits 162. The controller 198 is utilized to control the process sequence, regulating the gas flows from the gas source 110 into the processing chamber 100 and controlling ion bombardment of the target 114. The central processing unit 160 may be of any form of a general-purpose computer processor that can be used in an industrial setting. The software routines (e.g., instructions) can be stored in the memory 158 (e.g., non-transitory computer readable storage medium), such as random-access memory, read only memory, floppy or hard disk drive, or other form of digital storage. The support circuits 162 are conventionally coupled to the central processing unit 160 and may comprise cache, clock circuits, input/output subsystems, power supplies, and the like. The software routines, when executed by the central processing unit 160, transform the central processing unit into a specific purpose computer that controls the processing chamber 100 such that the processes disclosed below, are performed in accordance with embodiments of the present disclosure. The software routines may also be stored and/or executed by a second controller (not shown) that is located remotely from the processing chamber 100.

During processing, material is sputtered from the target 114 and deposited on the surface of the substrate 101. The target 114 and the substrate support 108 are biased relative to each other by the power supply 117 or the RF power source 180 to maintain a plasma formed from the process gases (e.g., at least one of argon (Ar), helium (He), krypton (Kr), neon (Ne), or xenon (Xe)) supplied by the gas source 110. The DC pulsed bias power applied to the collimator 118 also assists controlling ratio of the ions and neutrals passing through the collimator 118, advantageously enhancing the trench sidewall and bottom fill-up capability. The ions from the plasma are accelerated toward and strike the target 114, causing target material to be dislodged from the target 114. The dislodged target material and process gases forms a layer on the substrate 101 with desired compositions.

Figure 2A:
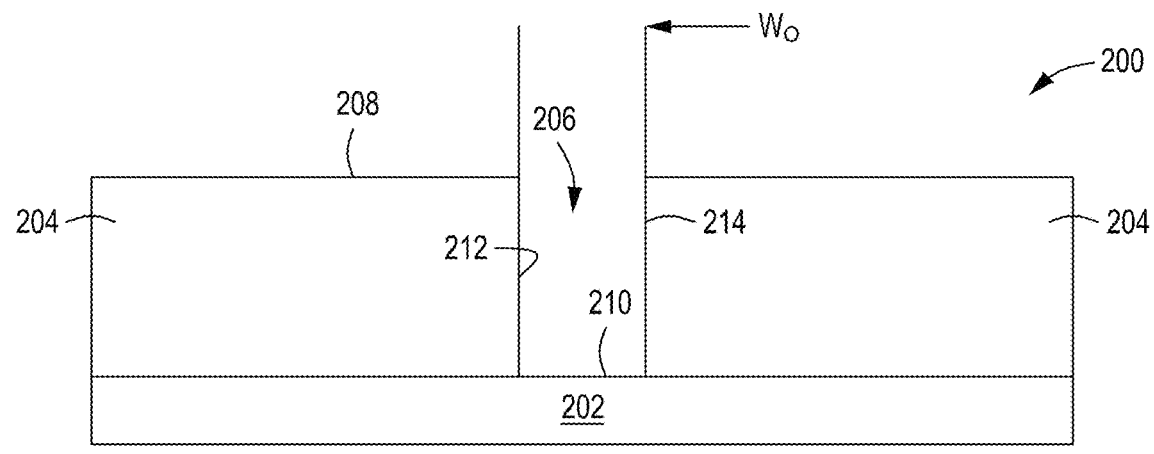
FIGS. 2A-2C are diagrams of a substrate with a material layer thereon having a reduced overhang, in accordance with at least some embodiments of the present disclosure.
Figure 2B:
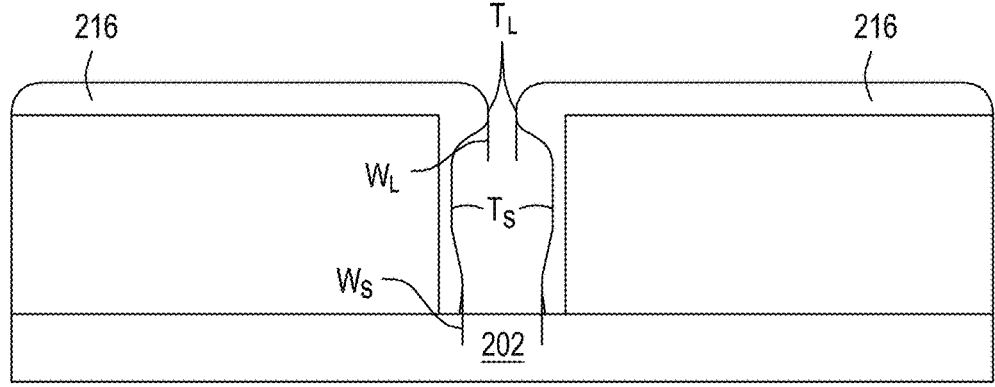
Figure 2C:
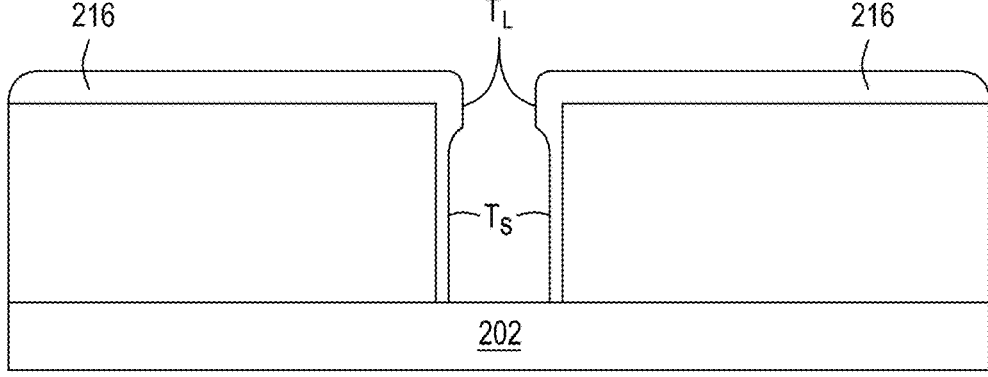

FIGS. 2A-2C are diagrams of a substrate 200 (e.g., the substrate 101) with a material layer thereon having a reduced overhang, in accordance with at least some embodiments of the present disclosure.

The substrate 200 comprises a base layer 202 and a layer 204 comprising a feature 206 (e.g., via, trench, dual damascene, etc.) extending a depth from a top surface 208 of the layer 204 to an exposed top surface 210 of the base layer 202 (FIG. 2A). In at least some embodiments, the depth of the feature 206 can extend to a bottom surface of the layer 204, e.g., the top surface 210 of the base layer 202 is covered by some of the layer 204 and is not exposed. The feature 206 has an opening width $W_O$ defined by a first sidewall 212 and a second sidewall 214. In some embodiments, the first sidewall 212 and the second sidewall 214 are opposite faces of a continuous sidewall (e.g., a circular via). The opening width $W_O$ is about 3 nm to about 40 nm, e.g., about 10 nm, 14 nm, 16 nm, 20 nm, 22 nm, 26 nm, or 28 nm.

The base layer 202 comprises a dielectric. For example, in at least some embodiments, the base layer 202 comprises or consists essentially of silicon carbide (SiC), silicon carbonitride (SiCN), silicon nitride (SIN), silicon oxide (SiO$_2$), silicon oxycarbide (SiOC), silicon oxynitride (SiON). As defined herein, a material which consists essentially of a stated material comprises greater than or equal to about 95%, greater than or equal to about 98%, greater than or equal to about 99% or greater than or equal to about 99.5% of the stated material on a molar basis.

FIG. 3 is a flowchart of a method 300 for processing a substrate (e.g., the substrate 200), in accordance with at least some embodiments of the present disclosure. The method 300 and processes associated therewith are controlled by the controller 198.

For example, with reference again to FIGS. 2A and 2B), at 302, the method 300 comprises sputtering a material (e.g., from the target 114) to form a material layer (e.g., material layer 216) on a layer comprising a feature (e.g., the feature 206) extending a depth from a top surface of the layer (e.g., the top surface 208 of the layer 204) to a top surface of a layer on which the layer is deposited (e.g., the top surface 210 of the base layer 202) in a PVD chamber (e.g., the processing chamber 100). As noted above, the material can be a conductive material comprising at least one of aluminum (Al), cobalt (Co), copper (Cu), indium (In), molybdenum (Mo), nickel (Ni), rhodium (Rh), ruthenium (Ru), tantalum (Ta), titanium (Ti), tungsten (W), alloys thereof, combinations thereof, or the like, or a dielectric material comprising at least one of aluminum oxide (AlO$_2$), aluminum oxynitride (such as ALON), aluminum nitride (AlN), rhodium nitride (RhN), ruthenium nitride (RuN), silicon oxide (SiO), tantalum nitride (TaN), tantalum oxynitride (TaOxNy), titanium oxynitride (TiOxNy), or tungsten nitride (WN). As also noted above, the feature can have an opening width (e.g., $W_O$) defined by the first sidewall 212 and the second sidewall 214. The material layer can have a greater lateral thickness ($T_L$) at the top surface than a thickness ($T_S$) on the first sidewall or the second sidewall within the feature (see FIG. 2B). In at least some embodiments, at 302, the material layer 216 can have a lateral thickness $T_L$ at the top surface outside of the feature of about 3 nm to about 40 nm, e.g., about 10 nm, 14 nm, 16 nm, 20 nm, 22 nm, 26 nm, or 28 nm. In at least some embodiments, at 302, the material layer 216 can have a lateral thickness $T_L$ of about 15 nm.

The difference between TL and Ts is, typically, referred to as an overhang. The opening $W_L$ of the feature at the top of the feature is less than the width $W_S$ of the feature between the first sidewall 212 and the second sidewall 214 with the material layer 216 deposited thereon.

The method 300 continues by reducing the overhang by a deposition-etch cycle, which comprises a deposition phase and an etch phase. In at least some embodiments, during the deposition-etch cycle the deposition phase can be performed prior to the etch phase, or vice versa.

For example, next, at 304, the method 300 comprises depositing additional material on the layer 204 (e.g., over the material layer 216) by biasing the layer with an RF bias at a low power. For example, the deposition phase deposits an additional material layer on the top surface 208 (e.g., on the material layer 216) by biasing the top surface 208 with an RF bias at low power bias. For example, the low power bias can be about 5 W to about 300 W (e.g., about 70 W to about 100 W). Additionally, the low power bias can be provided at a dual frequency, e.g., 2 MHz to about 60 MHz. In at least some embodiments, as described above, the low power bias can be provided at about 13.56 MHz to about 40 MHz.

Next, at 306, the method 300 comprises etching the material layer 216 from the layer by biasing the layer with an RF bias at a high-power. For example, the etch phase etches the material layer 216 from the top surface 208 by biasing the top surface 208 with RF bias at a high-power bias. For example, the high-power bias can be about 200 W to about 3000 W (e.g., about 1000 W, about 1400 W, or about 2000 W). The inventors have found that the high-power bias cannot be applied to the top surface 208 for an extended period of time. For example, if the high-power bias is applied for too long, the base layer 202 may be damaged by the high-power bias (e.g., arcing from the substrate to other portions of the processing chamber). Accordingly, the inventors have found that by using short bursts of high-power bias and low power bias the material layer 216 may be etched without damage to the underlying base layer 202. Additionally, the high-power bias can be provided at a dual frequency, e.g., 2 MHz to about 60 MHz. In at least some embodiments, the low power bias can be provided at about 13.56 MHz to about 40 MHz. In at least some embodiments, the low power bias and the high-power bias can be provided at the same frequency or a different frequency. In some embodiments, the substrate (e.g., including the base layer 302 base layer 202 and the layer 204) is substantially undamaged.

Next, at 308, the method 300 comprises repeatedly alternating between the low power bias and the high-power bias (between 304 and 306) at a predetermined frequency to reduce a difference between the lateral thickness at the top surface and the lateral thickness on the first sidewall or the second sidewall within the feature. For example, during the dep-etch cycle, the deposition phase and the etch phase are repeated in an alternating fashion. In at least some embodiments, the time between the deposition phase and the etch phase is minimized. For example, in at least some embodiments, the predetermined frequency at which the low power bias and the high-power bias can be about 1 Hz to about 100 kHz, e.g., about 10 kHz.

Similarly, a duty cycle, which is a time percentage of a cycle spent applying the RF bias at the high-power to the substrate surface, can be about 1% to about 99%, e.g., about 30%, about 40%, about 45%, about 50%, about 55%, about 60%, or about 70%.

During 308, a determination is made to see if the opening the width $W_O$ of the feature 206 is sufficient. For example, if the opening width $W_O$ is not sufficient, additional dep-etch cycles are performed at 308. For example, 308 (e.g., the dep-etch cycle) is repeated until a sufficient thickness of the overhang has been removed. For example, as illustrated in FIG. 2C, after a plurality of dep-etch cycles, a substrate has a material layer 216 with a reduced overhang. That is, the difference between the reduced lateral thickness $T_L$ at the top surface of the feature 206 and thickness $T_S$ on the first sidewall 212 and the second sidewall 214 within the featured 206 is reduced, cf. FIG. 2B with 2C, for example. In some embodiments, the thickness $T_S$ within the feature 206 is substantially unchanged by the dep-etch cycle. Alternatively, in some embodiments, the thickness $T_S$ within the feature 206 is increased by the dep-etch cycle.

The dep-etch cycle can deposit an additional material layer on the top surface 208 outside of the feature 206. For example, the dep-etch cycle deposits about 2 nm to about 8 nm of additional material layer on the top surface 208 outside of the feature 206. In at least some embodiments, the dep-etch cycle deposits about 4 nm to about 6 nm of an additional material layer on the top surface 208 outside of the feature 206.

After 308, if the opening width $W_O$ is sufficient, the substrate 200 may undergo further processing. For example, in at least some embodiments, the method 300 further comprises depositing a conductive fill material within the feature 206. The conductive fill material comprises a same or different material than the material layer 216. In at least some embodiments, the conductive fill material comprises a metal (e.g., comprises at least one of cobalt (Co), copper (Cu), indium (In), iridium (Ir), molybdenum (Mo), rhodium (Rh), ruthenium (Ru), or tungsten (W) or metal alloy (e.g., CuMn, CuAl, etc.).

In at least some embodiments, the opening width $W_O$ of the feature 206 is about 3 nm to about 40 nm before sputtering the material, sputtering the material forms a material layer 216 with a thickness of about 15 nm on the top surface 208 outside of the feature 206, and repeatedly alternating between the low power bias and the high-power bias forms an additional material layer with a thickness of about 6 nm on the top surface 208 outside of the feature 206. In such embodiments, the opening width $W_O$ of the feature 206 is greater than or equal to about 3 nm after sputtering the material and repeatedly alternating between the low power bias and the high-power bias.

While the foregoing is directed to embodiments of the present disclosure, other and further embodiments of the disclosure may be devised without departing from the basic scope thereof.

The invention claimed is:

1. A method of physical vapor deposition on a substrate comprising:
   I) sputtering a material from a target in a physical vapor deposition (PVD) chamber to form a sputtered material layer on a first layer comprising a feature extending a depth from a top surface of the first layer to a top surface of a base layer on which the first layer is deposited, prior to forming the sputtered material layer, the feature having an initial top opening width defined by a first sidewall and a second sidewall at the top surface of the first layer, and an initial internal width between the first sidewall and the second sidewall within the feature, after forming the sputtered material layer the feature having a sputtered top opening width which is less than the initial top opening width, the sputtered material layer forming an overhang of sputtered material extending away from the first sidewall and the second sidewall such that the sputtered material layer has a greater lateral thickness at the top surface of the first layer than a lateral thickness of sputtered material present on the first sidewall or the second sidewall within the feature;

II) repeating a deposition-etch cycle comprising:

i) depositing additional material on the sputtered material layer by biasing the first layer with an RF bias at a first power; followed by ii) etching the sputtered material from the sputtered material layer by biasing the sputtered material layer with an RF bias at a second power that is higher than the first power forming a cycled top opening width of the feature;

wherein the deposition-etch cycle further comprises alternating between the first power and the second power at a frequency of about 10 kHz to about 100 kHz, wherein the deposition-etch cycle is repeated until the cycled top opening width is greater than the sputtered top opening width; and III) depositing a conductive fill material within the feature.

2. The method of claim 1, wherein repeatedly alternating between the first power and the second power at the frequency results in a reduction of arcing between the substrate and the physical vapor deposition (PVD) chamber.

3. The method of claim 1, wherein a duty cycle of the RF bias is about 1% to about 99%, and wherein the duty cycle is a time percentage of a cycle spent applying the RF bias at the second power to the top surface of the first layer.

4. The method of claim 1, wherein the target comprises at least one of aluminum (Al), cobalt (Co), copper (Cu), indium (In), molybdenum (Mo), nickel (Ni), rhodium (Rh), ruthenium (Ru), tantalum (Ta), titanium (Ti), tungsten (W).

5. The method of claim 1, wherein the first power is about 5 W to about 100 W.

6. The method of claim 1, wherein the second power is at least one of about 1400 W, about 2000W, or about 3000 W.

7. The method of claim 1, wherein sputtering the material forms the material layer with a thickness of about 3 nm to 40 nm on the top surface of the first layer.

8. The method of claim 1, wherein repeatedly alternating between the first power and the second power forms the material layer with a thickness of about 3 nm to 20 nm on the top surface of the first layer.

9. The method of claim 1, wherein the initial top opening width of the feature is about 3 nm to about 40 nm before sputtering the material.

10. The method of claim 1, wherein the initial top opening width of the feature is about 3 nm to about 20 nm before sputtering the material, wherein sputtering the material forms the material layer with a thickness of about 3 nm to 40 nm on the top surface of the first layer, wherein repeatedly alternating between the RF bias at the first power and the RF bias at the second power forms the material layer with a thickness of about 3 nm to 40 nm on the top surface of the first layer, and wherein the cycled top opening width of the feature is greater than or equal to about 7 nm.

11. A method of physical vapor deposition on a substrate comprising:

I) sputtering a material from a target in a physical vapor deposition (PVD) chamber to form a sputtered material layer on a first layer comprising a feature extending a depth from a top surface of the first layer to a top surface of a base layer on which the first layer is deposited, prior to forming the sputtered material layer, the feature having an initial top opening width defined by a first sidewall and a second sidewall at the top surface of the first layer, and an initial internal width between the first sidewall and the second sidewall within the feature, after forming the sputtered material layer the feature having a sputtered top opening width which is less than the initial top opening width, the sputtered material layer forming an overhang of sputtered material extending away from the first sidewall and the second sidewall such that the sputtered material layer has a greater lateral thickness at the top surface of the first layer than a lateral thickness of sputtered material present on the first sidewall or the second sidewall within the feature;

II) repeating a deposition-etch cycle comprising:

i) depositing additional material on the sputtered material layer by biasing the first layer with an RF bias at a first power and at a dual frequency from about 2 MHz to about 60 MHz; followed by ii) etching the sputtered material from the sputtered material layer by biasing the sputtered material layer with an RF bias at a second power that is higher than the first power and at the dual frequency from about 2 MHz to about 60 MHz forming a cycled top opening width of the feature;

wherein the deposition-etch cycle further comprises alternating between the first power and the second power at a frequency of about 10 KHz to about 100 kHz, wherein the deposition-etch cycle is repeated until the cycled top opening width is greater than the sputtered top opening width; and III) depositing a conductive fill material within the feature.

12. A non-transitory computer readable storage medium having stored thereon instructions that when executed by a processor perform a method of physical vapor deposition on a substrate comprising:

I) sputtering a material from a target in a physical vapor deposition (PVD) chamber to form a sputtered material layer on a first layer comprising a feature extending a depth from a top surface of the first layer to a top surface of a base layer on which the first layer is deposited, prior to forming the sputtered material layer, the feature having an initial top opening width defined by a first sidewall and a second sidewall at the top surface of the first layer, and an initial internal width between the first sidewall and the second sidewall within the feature, after forming the sputtered material layer the feature having a sputtered top opening width which is less than the initial top opening width, the sputtered material layer forming an overhang of sputtered material extending away from the first sidewall and the second sidewall such that the sputtered material layer has a greater lateral thickness at the top surface of the first layer than a lateral thickness of sputtered material present on the first sidewall or the second sidewall within the feature;

II) repeating a deposition-etch cycle comprising:

i) depositing additional material on the sputtered material layer by biasing the first layer with an RF bias at a first power; followed by p1 ii) etching the sputtered material from the sputtered material layer by biasing the sputtered material layer with an RF bias at a second power that is higher than the first power forming a cycled top opening width of the feature;

wherein the deposition-etch cycle further comprises alternating between the first power and the second power at a frequency of about 10 KHz to about 100 kHz, wherein the deposition-etch cycle is repeated until the cycled top opening width is greater than the sputtered top opening width; and III) depositing a conductive fill material within the feature.

13. The non-transitory computer readable storage medium of claim 12, wherein the substrate is substantially undamaged.

14. The non-transitory computer readable storage medium of claim 12, wherein a duty cycle of the RF bias at the second power is about 1% to about 99%, and wherein the duty cycle is a time percentage of a cycle spent applying the RF bias at the second power to the top surface of the first layer.

15. The non-transitory computer readable storage medium of claim 12, wherein the target comprises at least one of aluminum (Al), cobalt (Co), copper (Cu), indium (In), molybdenum (Mo), nickel (Ni), rhodium (Rh), ruthenium (Ru), tantalum (Ta), titanium (Ti), tungsten (W).

16. The non-transitory computer readable storage medium of claim 12, wherein the RF bias at the first power is about 5 W to about 300 W.

17. The non-transitory computer readable storage medium of claim 12, wherein the second power is at least one of about 1400 W, about 2000W, or about 3000 W.

\* \* \* \* \*